(12) United States Patent
Seo et al.

(10) Patent No.: US 7,982,234 B2
(45) Date of Patent: Jul. 19, 2011

(54) LIGHT EMITTING DEVICE AND METHOD FOR FABRICATING THE SAME

(75) Inventors: Won Cheol Seo, Ansan-si (KR); Yun Goo Kim, Ansan-si (KR); Chang Youn Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 12/498,168

(22) Filed: Jul. 6, 2009

(65) Prior Publication Data
US 2010/0006881 A1    Jan. 14, 2010

(30) Foreign Application Priority Data

Jul. 8, 2008    (KR) .................. 10-2008-0066074
Jul. 9, 2008    (KR) .................. 10-2008-0066356

(51) Int. Cl.
*H01L 29/72*  (2006.01)
(52) U.S. Cl. ............... 257/98; 257/76; 257/81; 257/91; 257/99; 257/183; 257/401; 257/773
(58) Field of Classification Search .................... 257/76, 257/81, 91, 98, 99, 183, 401, 773
See application file for complete search history.

(56) References Cited

U.S. PATENT DOCUMENTS
2009/0283782 A1*  11/2009  Shakuda ............... 257/94
* cited by examiner

*Primary Examiner* — Edward Wojciechowicz
(74) *Attorney, Agent, or Firm* — H.C. Park & Associates, PLC

(57) ABSTRACT

There is provided a light emitting device, which comprises compound semiconductor layers including a first conductive semiconductor layer, an active layer and a second conductive semiconductor layer; a metal reflection layer formed on a region of the second conductive semiconductor layer; an insulating structure formed at least in a boundary region of the second conductive semiconductor layer; a metal material structure formed to cover the second conductive semiconductor layer having the metal reflection layer and the insulating structure formed; and a substrate bonded to the metal material structure, wherein the boundary region of the second conductive semiconductor layer includes an outer region of the second conductive semiconductor layer along an outer circumference of the second conductive semiconductor layer.

21 Claims, 16 Drawing Sheets

LIGHT EMITTING DEVICE AND METHOD FOR FABRICATING THE SAME

CROSS REFERENCE TO RELATED APPLICATIONS

This application claims priority from and the benefit of Korean Patent Application No. 10-2008-0066074, filed on Jul. 8, 2008, and Korean Patent Application No. 10-2008-0066356, filed on Jul. 9, 2008, all of which are hereby incorporated by reference for all purposes as if fully set forth herein.

BACKGROUND OF THE INVENTION

1. Field of the Invention

Exemplary embodiments of the present invention relate to a light emitting device and a method for fabricating the same, and more particularly, to a light emitting device, which is configured to prevent or minimize exposure of a protective metal layer.

2. Discussion of the Background

In general, since Group-III-element nitrides, such as GaN and AlN, have excellent thermal stability and a direct-transition-type energy band structure, they have recently come into the spotlight as a material for light emitting devices in blue and ultraviolet regions. Particularly, blue and green light emitting devices using GaN are used in various applications such as large-sized full-color flat panel displays, traffic lights, indoor illumination, high-density light sources, high-resolution output systems and optical communications.

Such a Group-III-element nitride, particularly GaN, is grown on a heterogeneous substrate with a similar crystal structure through a metal organic chemical vapor deposition (MOCVD) method, a molecular beam epitaxy (MBE) method, or the like because it is difficult to form a homogeneous substrate on which GaN is grown. A sapphire substrate with a hexagonal system structure is mainly used as the heterogeneous substrate. However, since sapphire is an electrical nonconductor, it limits the structure of a light emitting diode (LED). Since sapphire is mechanically and chemically very stable, it is difficult to perform processing, such as cutting, shaping and the like, and the thermal conductivity of the sapphire is low. Accordingly, studies have been recently conducted to develop a method in which nitride semiconductor layers are grown on a heterogeneous substrate such as sapphire, and the heterogeneous substrate is separated from the nitride semiconductor layers, thereby fabricating a vertical type LED.

FIG. 1 is a sectional view illustrating a conventional vertical type LED.

Referring to FIG. 1, the vertical type LED includes a conductive substrate 31. Compound semiconductor layers including an N-type semiconductor layer 15, an active layer 17 and a P-type semiconductor layer 19 are formed on the conductive substrate 31. Also, a metal reflection layer 23, a protective metal layer 25 and an adhesive layer 27 are interposed between the conductive substrate 31 and the P-type semiconductor layer 19.

Generally, the compound semiconductor layers are grown on a sacrificial substrate (not shown), such as a sapphire substrate, using a MOCVD method or the like. Then, the metal reflection layer 23, the protective metal layer 25, and the adhesive layer 27 are formed on the compound semiconductor layers, and the conductive substrate 31 adheres thereto. Subsequently, the sacrificial substrate is separated from the compound semiconductor layers using a laser lift-off method or the like, and the N-type semiconductor layer 15 is exposed. Thereafter, the compound semiconductor layers are separated into respective light emitting cell regions on the conductive substrate 31 through an etching process. Then, an electrode pad 33 is formed on the N-type semiconductor layer 15 in each of the light emitting cell regions, and individual devices are separated by dicing the conductive substrate 31 for each of the light emitting cell regions. Accordingly, the conductive substrate 31 having an excellent heat radiation performance is employed, thereby improving light emitting efficiency of an LED and providing the LED of FIG. 1 having a vertical structure.

However, in cases when the vertical type LED uses the conductive substrate, a dry etching process is typically performed to separate respective cells from each other when fabricating them. Since such an etching process is to separate the device itself into the respective cells, it is performed to have a depth (2 μm or more) deeper than a mesa etching process. Therefore, the etching process is performed to have a depth deeper than the actually etched depth in order to remove residue partially remaining at the exposed portion after the etching.

In the etching process, the protective metal layer 25 that protects the metal reflection layer 23 is etched, and etched residue thereof adhere to sides of each of the cells. The residue adhering to each cell electrically connect the N-type semiconductor layer 15 and the P-type semiconductor layer 19 to each other, thereby causing a short circuit. Such residue that may be produced in the etching process should be removed through a wet etching process. However, it is difficult to remove the residue because metals such as W, Pt, or Ni used as the protective metal layer 25 are generally not removed even through the wet etching process.

SUMMARY OF THE INVENTION

Exemplary embodiments of the present invention provide a light emitting device and a method for fabricating the same, wherein it is possible to solve deterioration of electrical characteristics due to adhesion of residue from a protective metal layer produced in a dry etching process to compound semiconductors.

Additional features of the invention will be set forth in the description which follows, and in part will be apparent from the description, or may be learned by practice of the invention.

An exemplary embodiment of the present invention discloses a light emitting device having compound semiconductor layers comprising a first conductive semiconductor layer, an active layer, and a second conductive semiconductor layer; a metal reflection layer disposed on a region of the second conductive semiconductor layer; an insulating structure disposed at least in a boundary region of the second conductive semiconductor layer; a metal material structure disposed on the second conductive semiconductor layer; and a substrate disposed on the metal material structure, wherein the boundary region of the second conductive semiconductor layer comprises an outer region of the second conductive semiconductor layer along an outer circumference of the second conductive semiconductor layer.

An exemplary embodiment of the present invention also discloses a method for fabricating a light emitting device by disposing a first conductive semiconductor layer, an active layer, and a second conductive semiconductor layer on a sacrificial layer, and disposing a metal reflection layer on a region of the second conductive semiconductor layer; disposing an insulating structure at least in a boundary region of the second conductive semiconductor layer; disposing a metal material structure on the second conductive semiconductor layer; disposing a bonding substrate on the metal material structure, and removing the sacrificial layer to expose the first conductive semiconductor layer; and etching the first conductive semiconductor layer, the active layer, and the second conductive semiconductor layer until the insulating structure is exposed, wherein the boundary region of the second conductive semiconductor layer comprises an outer region of the second conductive semiconductor layer along an outer circumference of the second conductive semiconductor layer.

An exemplary embodiment of the present invention also discloses a light emitting device having compound semiconductor layers comprising a first conductive semiconductor layer, an active layer, and a second conductive semiconductor layer; a metal reflection layer disposed on a region of the second conductive semiconductor layer; an insulating structure disposed on at least a plurality of sides of the active layer and the second conductive semiconductor layer; a metal material structure disposed on the second conductive semiconductor; and a substrate disposed on the metal material structure, wherein the insulating structure is disposed to expose a portion of the metal material structure.

An exemplary embodiment of the present invention also discloses a method for fabricating a light emitting device by disposing compound semiconductor layers, comprising a first conductive semiconductor layer, an active layer, and a second conductive semiconductor layer on a sacrificial substrate, and performing a mesa etching process to expose the sacrificial substrate or the first conductive semiconductor layer; disposing a metal reflection layer on a region of the second conductive semiconductor layer; disposing an insulating structure on at least a plurality of sides of the active layer and the second conductive semiconductor layer; disposing a metal material structure and a bonding substrate on the second conductive semiconductor layer, and removing the sacrificial substrate to expose the first conductive semiconductor layer; and performing an etching process to separate the compound semiconductor layers into individual elements in a state wherein the insulating structure is disposed on at least the plurality of sides of the active layer and the second conductive semiconductor layer, wherein the insulating structure is disposed to expose a portion of the metal material structure.

An exemplary embodiment of the present invention also discloses a light emitting device having a substrate; a light emitting structure of a compound semiconductor positioned on a first region of the substrate, the light emitting structure comprising a first conductive upper semiconductor layer, an active layer, and a second conductive lower semiconductor layer; a separated layer of a first conductive semiconductor layer positioned on a second region of the substrate while being spaced apart from the light emitting structure; a metal material structure positioned between the light emitting structure and separated layer and the substrate to electrically connect the second conductive lower semiconductor layer and the separated layer to each other; and an insulating structure disposed on a side of the light emitting structure to isolate the metal material structure from the first conductive upper semiconductor layer and the active layer.

An exemplary embodiment of the present invention also discloses a method for fabricating a light emitting device by forming compound semiconductor layers on a sacrificial substrate, the compound semiconductor layers comprising a first conductive semiconductor layer, a second conductive semiconductor layer, and an active layer interposed between the first conductive semiconductor layer and the second conductive semiconductor layer, the first conductive semiconductor layer being positioned close to the sacrificial substrate; forming a mesa by patterning the compound semiconductor layers so that the first conductive semiconductor layer is exposed around the mesa; disposing an insulating structure on the active layer and the first conductive semiconductor layer exposed around the mesa so that a region of the first conductive semiconductor layer is partially exposed around the mesa; forming a metal material structure for electrically connecting the mesa and the region of the first conductive semiconductor layer exposed around the mesa; disposing a substrate on the metal material structure; removing the sacrificial substrate to expose the first conductive semiconductor layer; and patterning the exposed first conductive semiconductor layer to separate the region of the first conductive semiconductor layer around the mesa from the first conductive semiconductor layer on the mesa.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
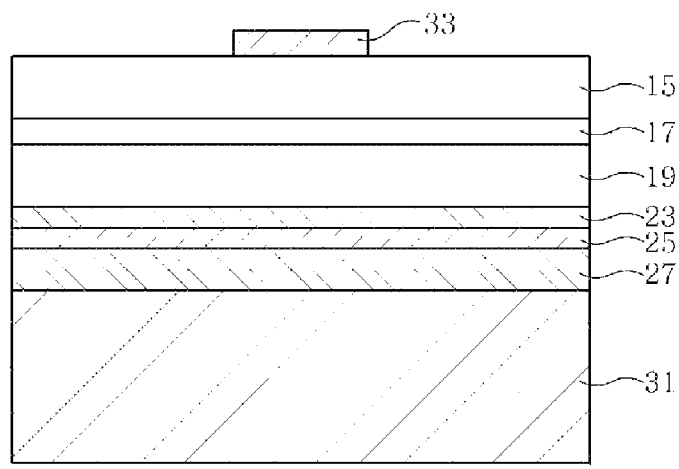
FIG. 1 is a sectional view illustrating a conventional vertical light emitting diode (LED)

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
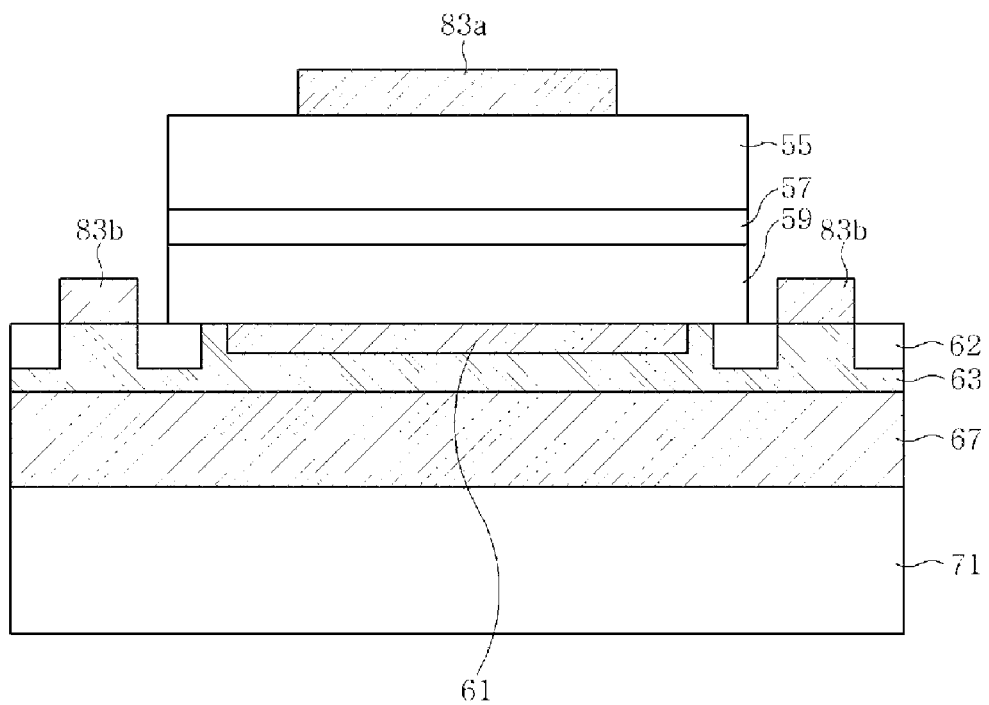
FIG. 2 is a sectional view illustrating an LED according to an exemplary embodiment of the present invention.

FIG. 2 is a sectional view illustrating an LED according to an exemplary embodiment of the present invention.

Referring to FIG. 2, compound semiconductor layers including an N-type semiconductor layer 55, an active layer 57 and a P-type semiconductor layer 59 are positioned on a region of a bonding substrate 71. Although the bonding substrate 71 may be a sapphire substrate, the bonding substrate is not limited thereto but may be another heterogeneous substrate. In the meantime, the compound semiconductor layers are III-N-based compound semiconductor layers, e.g., (Al, Ga, In)N semiconductor layers.

A metal reflection layer 61, an insulating structure 62, and a metal material structure 63 are interposed between the compound semiconductor layers and the bonding substrate 71.

The metal reflection layer 61 is formed of a metallic material having high reflectance, e.g., Ag or Al.

The insulating structure 62 is formed in a boundary region of the P-type semiconductor layer 59. Here, the boundary region of the P-type semiconductor layer 59 is a region including the P-type semiconductor layer 59 and an outer region of the P-type semiconductor layer 59 along an outer circumference of the P-type semiconductor layer 59. In this exemplary embodiment, the insulating structure 62 is formed to extend between the P-type semiconductor layer 59 and the metal material structure 63 while being in contact with at least a portion of the bottom surface of the P-type semiconductor layer 59. The insulating structure 62 may include, for example, $SiO_2$, SiN, MgO, TaO, $TiO_2$, or polymer. The insulating structure 62 may have open regions so that the metal material structure 63 is exposed through at least a portion of the insulating structure 62. The open regions may be formed by patterning the insulating structure 62. The metal material structure 63 is exposed through the open regions of the insulating structure 62, and P-type electrodes 83b are formed on the exposed metal material structure 63.

The metal material structure 63 comprises a protective metal layer that covers the P-type semiconductor layer 59 on which the metal reflection layer 61 and the insulating structure 62 are formed. The protective metal layer prevents metal elements from being diffused to the metal reflection layer 61 from an adhesive layer 67, so that the reflectance of the metal reflection layer 61 can be maintained. The metal material structure 63 protects the metal reflection layer 61 and also becomes a layer exposed when an etching process is performed after the removal of a sacrificial substrate. Residue may be produced from the metal material structure 63 by a dry etching process. Only the portion of the metal material structure 63, which is exposed through the open regions of the insulating structure 62, is etched, and therefore, the produced residue is remarkably decreased as compared with conventional LED process techniques. Accordingly, it is possible to remarkably reduce the influence that the corresponding residue electrically affect the N-type semiconductor layer 55, the active layer 57 and the P-type semiconductor layer 59.

In the exemplary embodiment, the metal material structure 63 being in contact with the P-type electrode 83b is filled in to the top surface of the insulating structure 62. Thus, the top surfaces of the metal material structure 63 and the insulating structure 62 may be coplanar. However, the present invention is not limited thereto, but the P-type electrode 83b may be formed to be filled in to the bottom surface of the insulating structure 62. Thus, a top surface of portion of the metal material structure is coplanar with a bottom surface of the insulating structure.

The adhesive layer 67 prevents the bonding substrate 71 from being separated from the metal reflection layer 61 by enhancing the adhesive strength between the bonding substrate 71 and the metal reflection layer 61.

Meanwhile, an N-type electrode 83a is formed on the N-type semiconductor layer 55, and the P-type electrodes 83b are formed on the metal material structure 63 exposed through the at least the portion (open regions) of the insulating structure 62. Accordingly, current is supplied through the N-type electrode 83a and the P-type electrodes 83b, whereby light is emitted.

FIG. 3, FIG. 4, FIG. 5, FIG. 6, FIG. 7, FIG. 8, FIG. 9, FIG. 10, FIG. 11, FIG. 12, and FIG. 13 are sectional and plan views illustrating a method for fabricating an LED according to an exemplary embodiment of the present invention.

Figure 3:
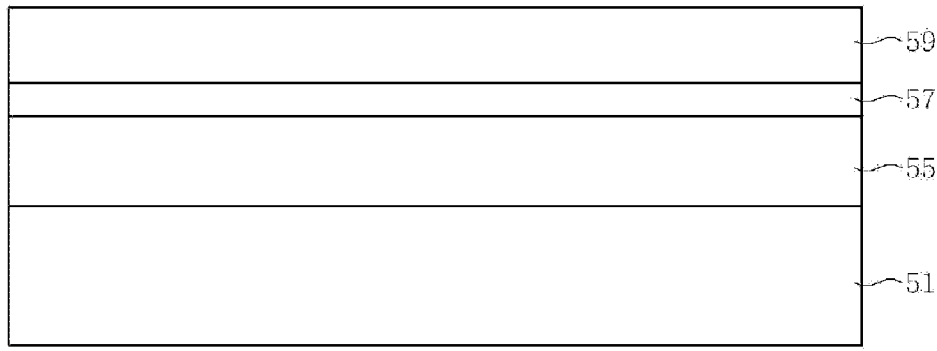
FIG. 3, FIG. 4, FIG. 5, FIG. 6, FIG. 7, FIG. 8, FIG. 9, FIG. 10, FIG. 11, FIG. 12, and FIG. 13 are sectional and plan views illustrating a method for fabricating an LED according to an exemplary embodiment of the present invention.

Referring to FIG. 3, compound semiconductor layers are formed on a sacrificial substrate 51. Although the sacrificial substrate 51 may be a sapphire substrate, the sacrificial substrate is not limited thereto but may be another heterogeneous substrate. The compound semiconductor layers include an N-type semiconductor layer 55, an active layer 57, and a P-type semiconductor layer 59. The compound semiconductor layers are III-N-based compound semiconductors and may be grown using a metal organic chemical vapor deposition (MOCVD) method, a molecular beam epitaxy (MBE) method, or the like.

Meanwhile, before the compound semiconductor layers are formed, a buffer layer (not shown) may be formed on the sacrificial substrate 51. The buffer layer is employed to reduce lattice mismatch between the compound semiconductor layers and the sacrificial substrate 51, and may be generally a GaN-based material layer.

Figure 4:
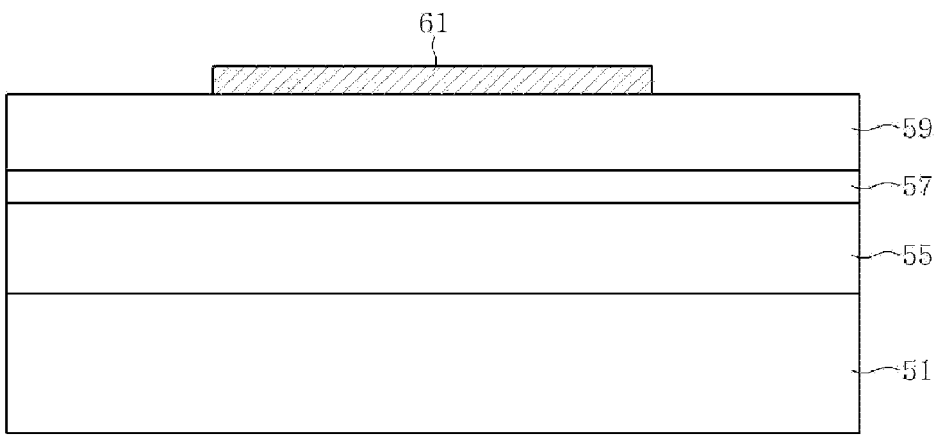

Referring to FIG. 4, a metal reflection layer 61 is formed on a region of the P-type semiconductor layer 59. For example, the metal reflection layer 61 may be formed of Ag or Al using a plating or deposition method.

Figure 5:
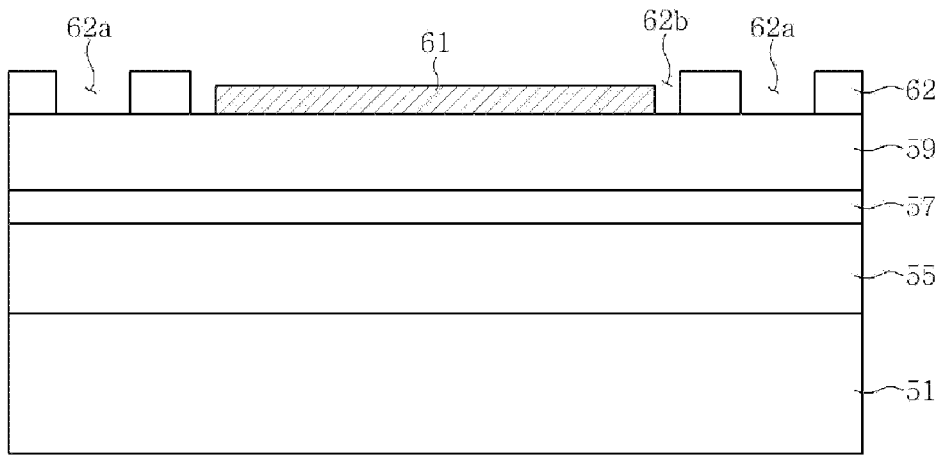
Figure 6:
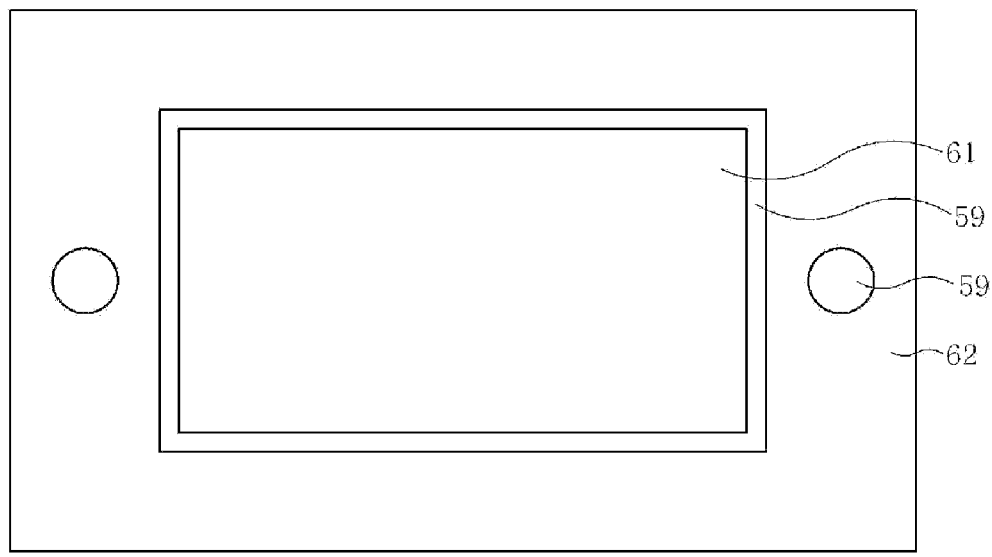

Referring to FIG. 5, an insulating structure 62 is formed on the P-type semiconductor layer 59 on which the metal reflection layer 61 is formed. The insulating structure 62 may be formed to have a thickness higher than that of the metal reflection layer 61. However, the present invention is not limited thereto but may be modified without limit. At least a portion of the insulating structure 62 has open regions 62a and 62b so that the P-type semiconductor layer 59 is exposed. Referring to FIG. 6, which is a plan view of the process shown in FIG. 5, portions of the P-type semiconductor layer 59 are exposed through the open regions 62a and 62b of the insulating structure 62. The open regions 62a and 62b of the insulating structure 62 are filled with a metal material structure 63 through a subsequent process.

Figure 7:
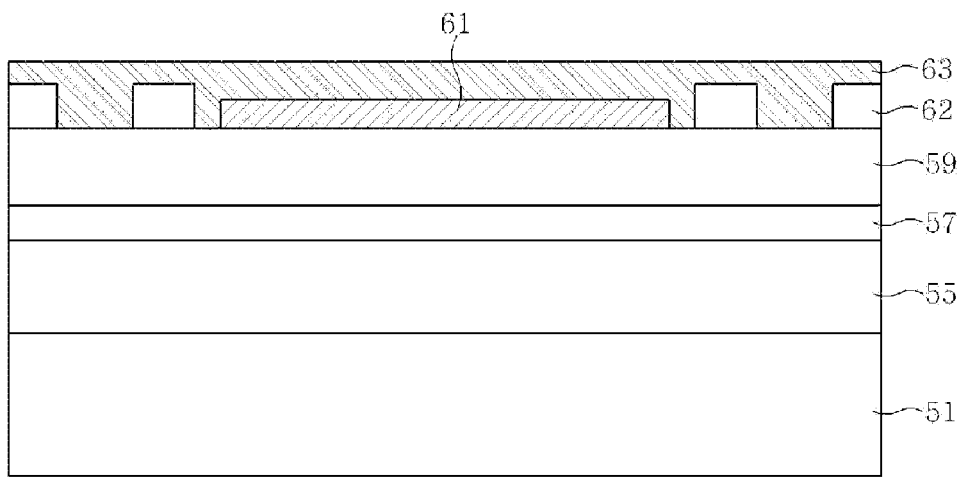

Referring to FIG. 7, after the insulating structure 62 is formed, the metal material structure 63 is formed to cover the insulating structure 62. The metal material structure 63 may formed of, for example, Ni, Ti, Ta, Pt, W, Cr, Pd, or the like. The metal material structure 63 is formed on the portions of the P-type semiconductor layer 59 exposed through the open regions 62a and 62b of the insulating structure 62 and the metal reflection layer 61.

Figure 8:
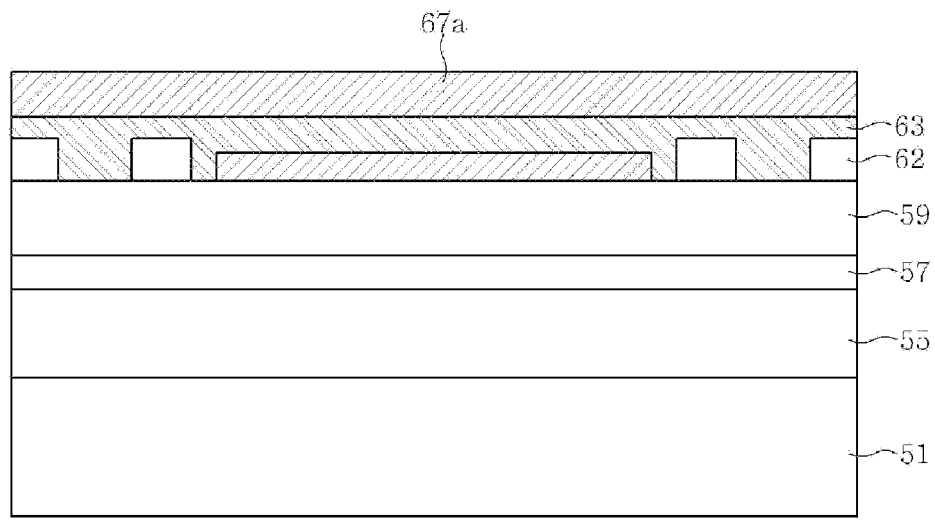

Referring to FIG. 8, a first bonding metal 67a is formed on the insulating structure 62. For example, the first bonding metal 67a may be formed to have a thickness of 15,000 Å using AuSn (80/20 wt %).

Figure 9:
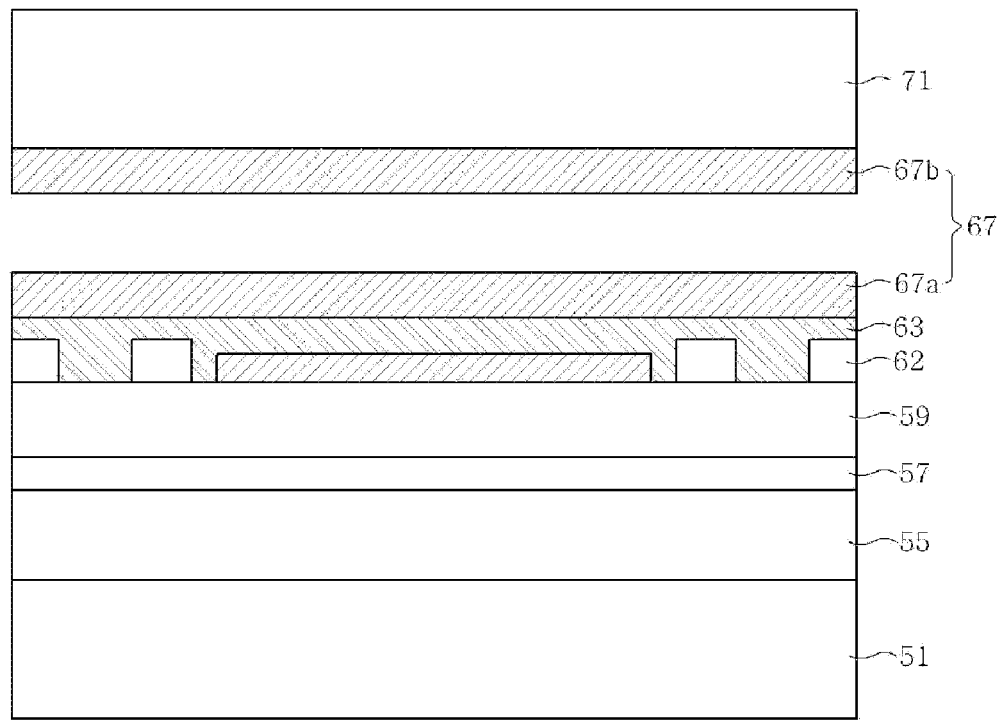

Referring to FIG. 9, a bonding substrate 71 having a second bonding metal 67b formed thereon is bonded on the first bonding metal 67a. Together the first bonding metal 67a and the second bonding metal 67b form the adhesive layer 67.

Figure 10:
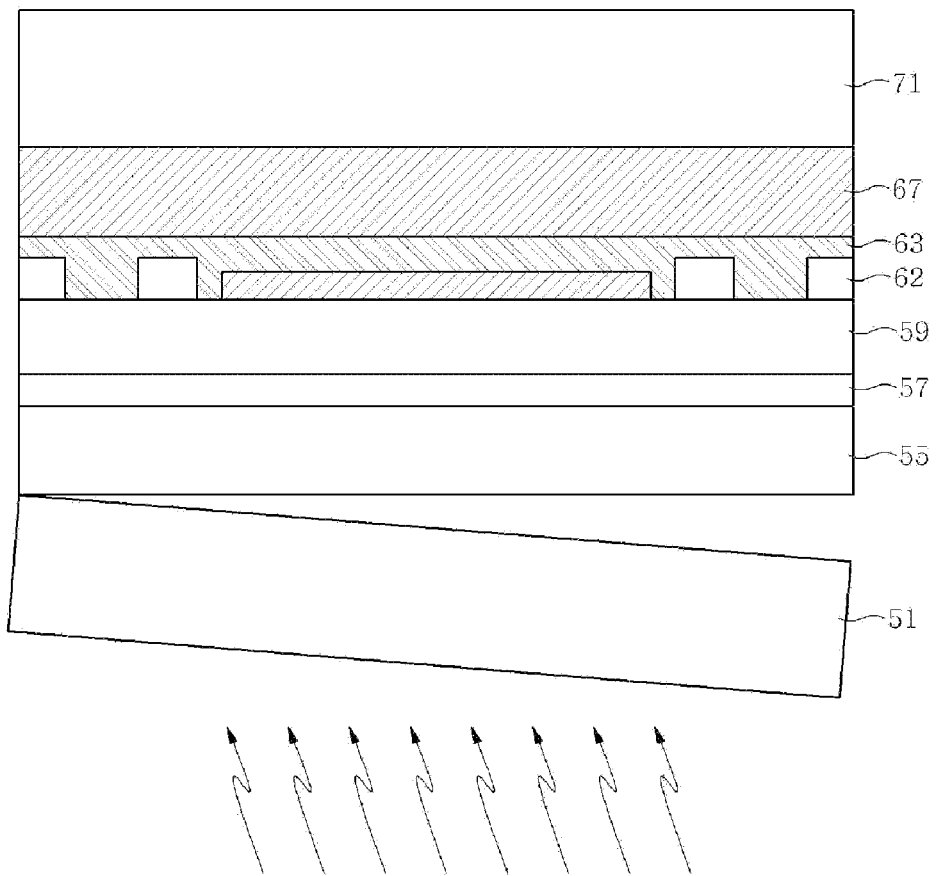
Figure 11:
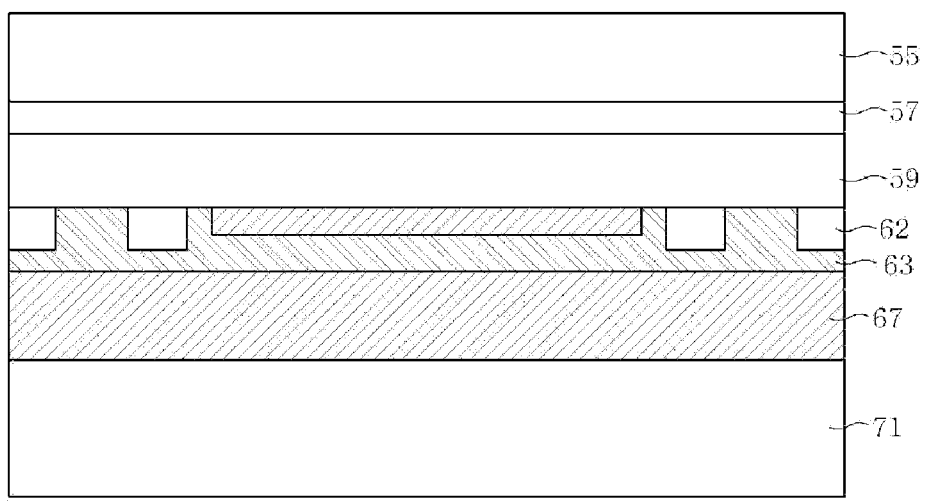

Referring to FIG. 10, the sacrificial layer 51 is separated from the compound semiconductor layers. The sacrificial substrate 51 may be separated using a laser lift-off (LLO) method or another mechanical or chemical method. At this time, the buffer layer (not shown) is also removed so that the N-type semiconductor layer 55 is exposed. The N-type semiconductor layer 55 exposed through the removal of the sacrificial layer 51 is made to face upward, thereby having the shape shown in FIG. 11.

Figure 12:
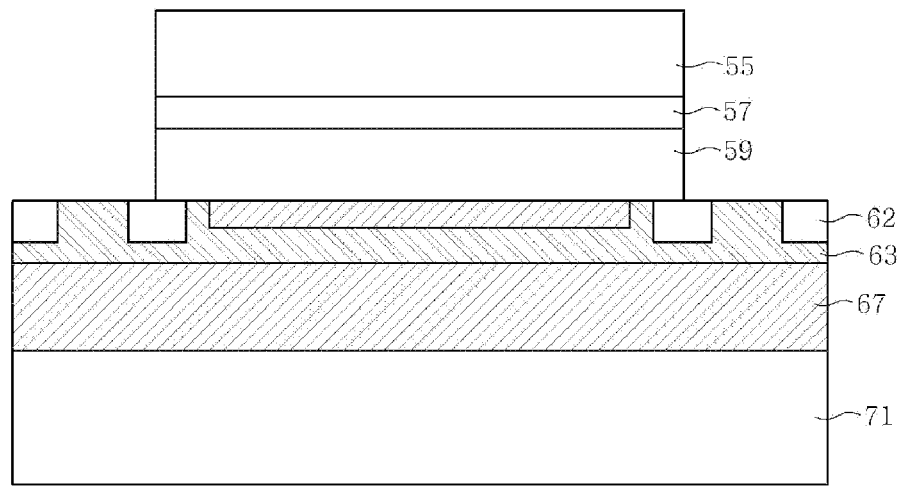

Referring to FIG. 12, the P-type semiconductor layer 59, the active layer 57, and the N-type semiconductor layer 55 are subjected to a mesa etching process. The mesa etching process is performed until the insulating structure 62 and the metal material structure 63, which are formed under the P-type semiconductor layer 59, are exposed. Accordingly, sides of the P-type semiconductor layer 59, the active layer 57, and the N-type semiconductor layer 55 are exposed by partially etching the P-type semiconductor layer 59, the active layer 57, and the N-type semiconductor layer 55.

Figure 13:
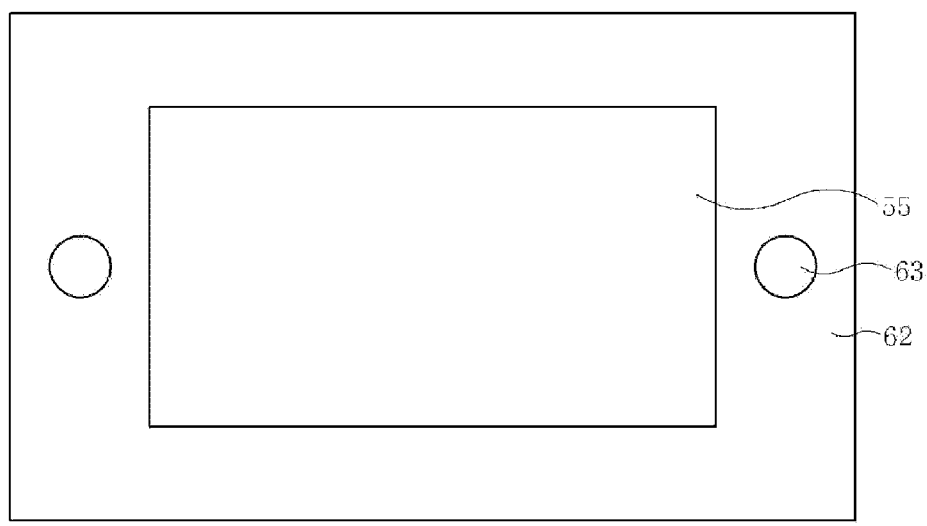
Figure 14:
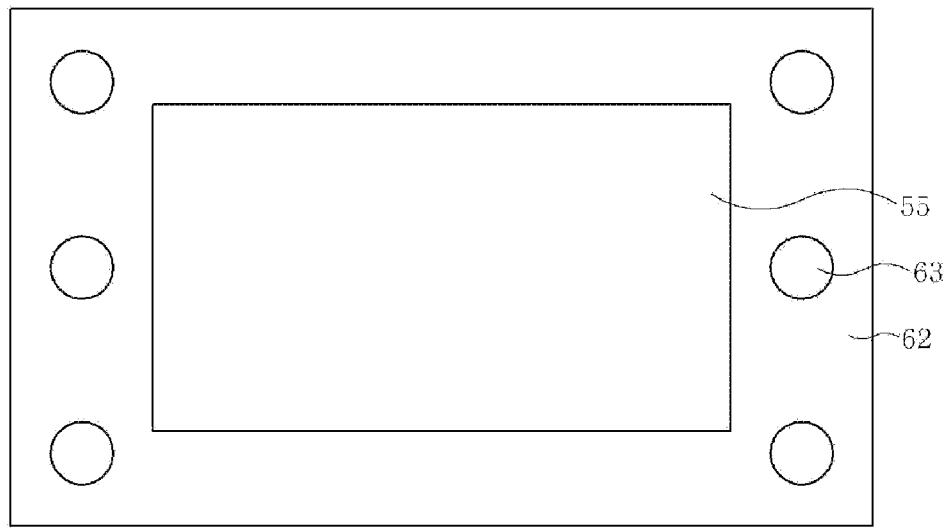
FIG. 14, FIG. 15, FIG. 16, and FIG. 17 are plan views illustrating a method for fabricating an LED according to another exemplary embodiment of the present invention.

Referring to FIG. 13, which is a plan view of the process shown in FIG. 12, portions of the metal material structure 63 are exposed through the open regions of the insulating structure 62.

Thereafter, an N-type electrode 83a is formed on the N-type semiconductor layer 55, and P-type electrodes 83b are formed on the metal material structure 63 exposed through a dry etching process. Then, a dry etching process is performed to separate the compound semiconductor layers into unit cell regions, thereby completing the LED shown in FIG. 2.

Meanwhile, a portion of the metal material structure 63 may be etched when performing the dry etching process performed after the mesa etching process of FIG. 12, and accordingly, residue from the metal material structure 63 may be produced. However, the area of the metal material structure 63, residue that may be produced by the etching process, corresponds to a region of the entire area of the insulating structure 62 as shown in FIG. 13. Therefore, the amount of the residue produced by the etching process is remarkably decreased as compared with the conventional LED.

For example, the aforementioned insulating structure 62 may be formed so that inner and outer portions are separated by the open regions filled with the metal material structure 63. Also, the inner and outer portions are not completely separated, but open regions partially formed at places are filled with the metal material structure 63.

Figure 15:
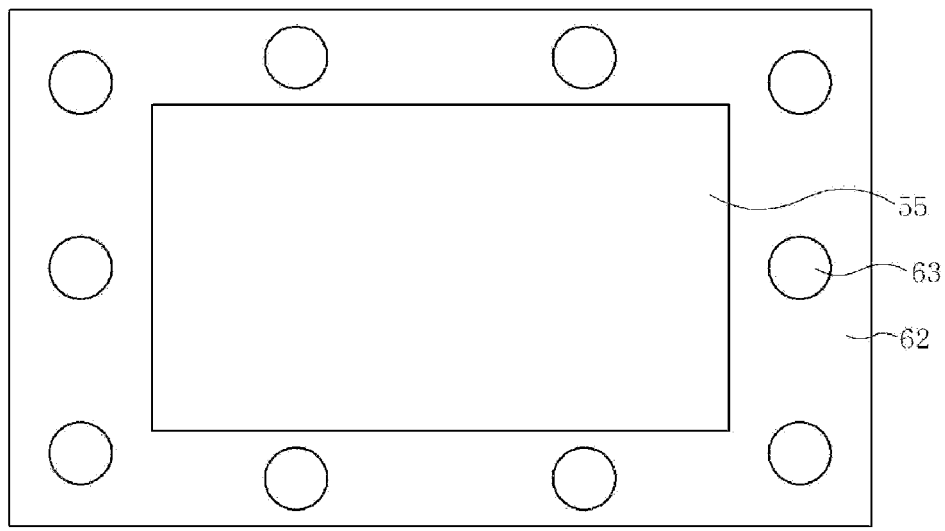
Figure 16:
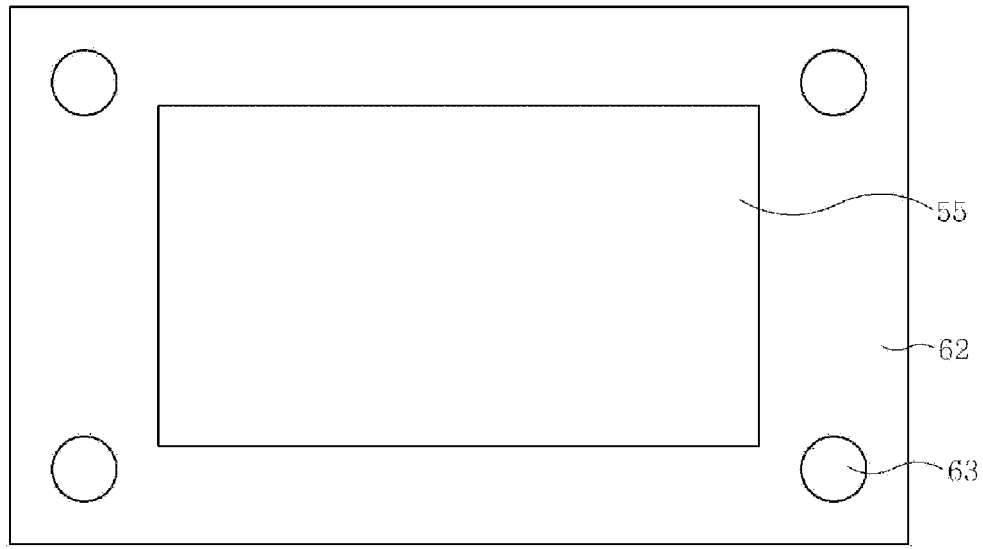
Figure 17:
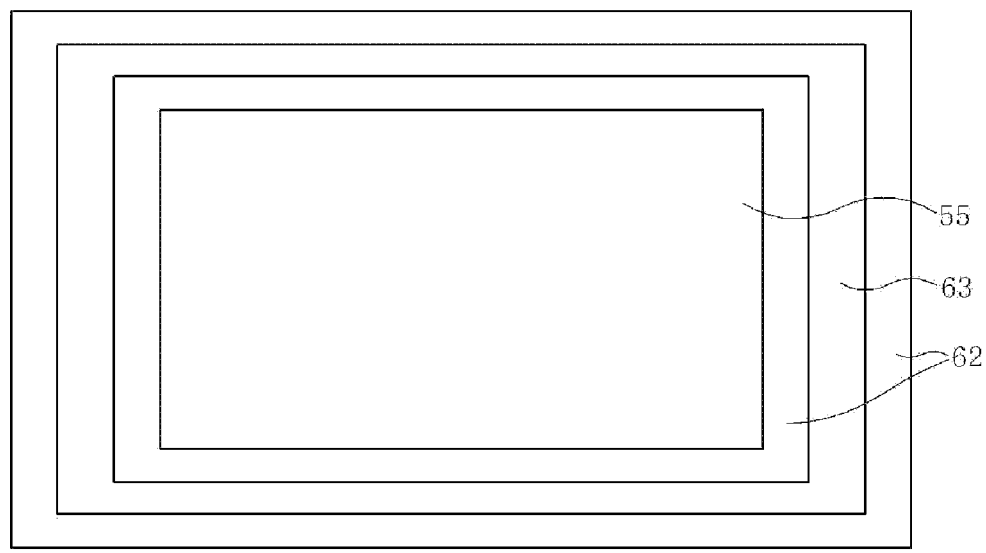

FIG. 14, FIG. 15, FIG. 16, and FIG. 17 are plan views corresponding to FIG. 13, illustrating shapes of the insulating structure 62 according to modified exemplary embodiments of the present invention. In FIG. 13, the metal material structure 63 is exposed through two open regions, each of which is positioned at each of the left and right sides with respect to the exposed N-type semiconductor layer 55. However, referring to FIG. 14, the metal material structure 63 is exposed through six open regions, each three of which are positioned at each of the left and right sides. Referring to FIG. 15, the metal material structure 63 is exposed at the upper and lower sides in addition to the left and right sides. Referring to FIG. 16, the metal material structure 63 is exposed at respective corners of the rectangle with respect to the exposed N-type semiconductor layer 55. In the shapes shown in FIG. 14, FIG. 15, and FIG. 16, the metal material structure 63 filled in the open regions partially formed at places on the insulating structure 62 is exposed. However, FIG. 17 shows that the insulating layer formed by surrounding the exposed N-type semiconductor layer 55 is separated into inner and outer portions by the metal material structure 63.

In addition, the N-type semiconductor layer 55 on which the N-type electrode 83a is formed is formed with a concavo-convex surface through a roughening process, thereby improving light extraction efficiency.

Figure 18:
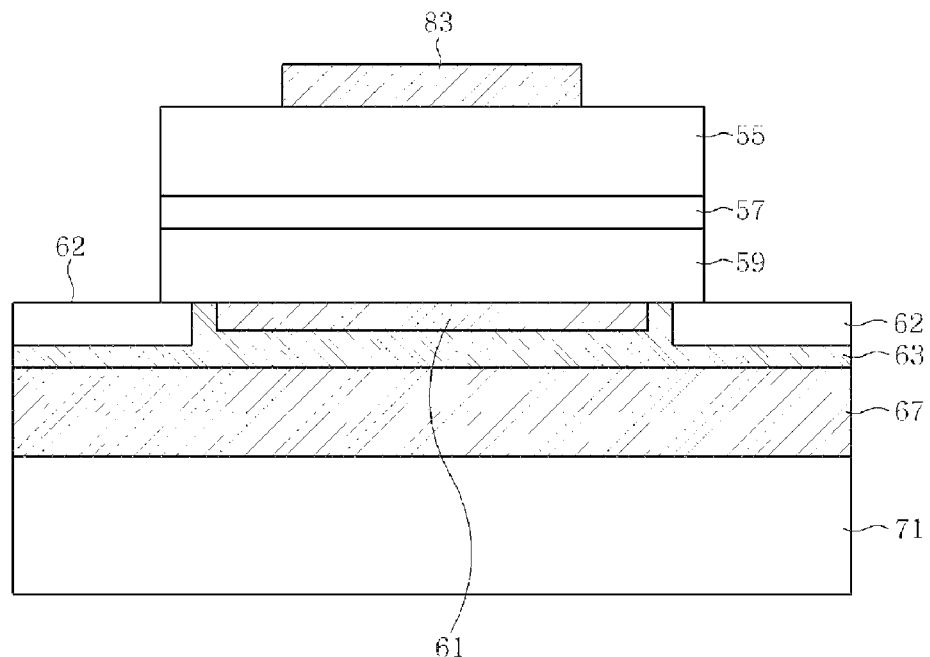
FIG. 18 is a sectional view illustrating an LED according to another exemplary embodiment of the present invention.

Further, it has been described in the exemplary embodiment of the present invention that the P-type 83b electrode is formed on the metal material structure 63 exposed through the insulating structure 62 formed to expose a portion of the metal material structure 63. However, the present invention is not limited thereto, but a modification shown in FIG. 18 is possible. Referring to FIG. 18, compound semiconductor layers including an N-type semiconductor layer 55, an active layer 57, and a P-type semiconductor layer 59 are formed. A metal reflection layer 61 is formed on a region of the P-type semiconductor layer 59. Also, an insulating structure 62 is formed at least in a boundary region of the second conductive semiconductor layer 59. Here, the boundary region of the P-type semiconductor layer 59 is a region including an outer region of the P-type semiconductor layer 59 along an outer circumference of the P-type semiconductor layer 59. In this exemplary embodiment, the insulating structure 62 is formed to extend on at least a portion of the bottom surface of the P-type semiconductor layer 59, but the present is not limited thereto.

A metal material structure 63 is formed to cover the P-type semiconductor layer 59 which is formed with the metal reflection layer 61 and the insulating structure 62. An adhesive layer 67 is interposed between the metal material structure 63 and a conductive substrate 71 so that the conductive substrate 71 is bonded to the metal material structure 63. An N-type electrode 83 is formed on the first conductive semiconductor layer 55, and the conductive substrate 71 is used as a P-electrode.

It has been described in the exemplary embodiment of the present invention that the insulating structure 62 is formed to be spaced apart from the metal reflection layer 61. However, the present invention is not limited thereto. That is, in another exemplary embodiment of the present invention, the insulating structure 62 may be formed to extend so as to be in contact with a side of the metal reflection layer 61. In a further exemplary embodiment of the present invention, the insulating structure 62 may be formed to extend so as to cover at least a portion of the metal reflection layer 61. In a still further exemplary embodiment of the present invention, the insulating structure 62 may be formed to extend so as to cover at least a portion of the metal reflection layer 61 while being in contact with a side of the metal reflection layer 61.

Figure 19:
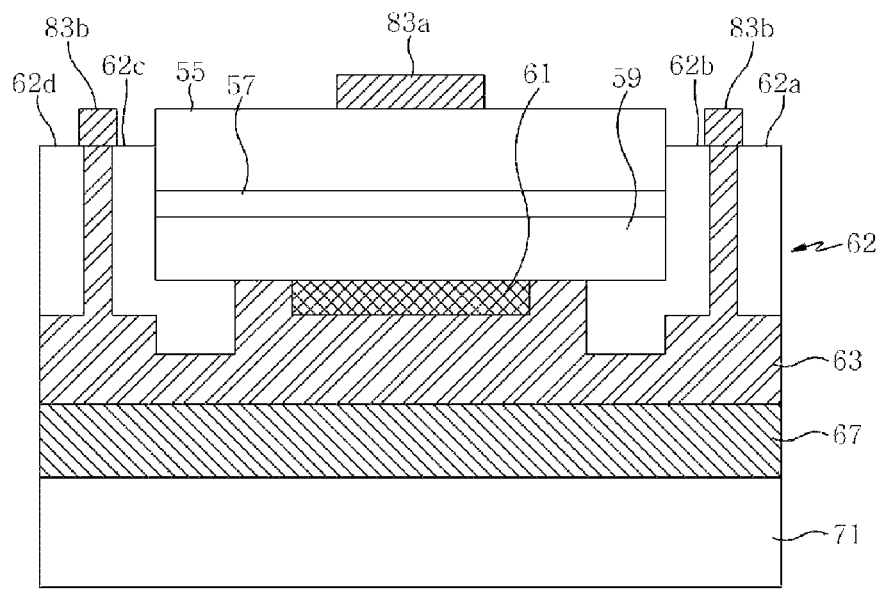
FIG. 19 is a sectional view illustrating an LED according to a further exemplary embodiment of the present invention.

FIG. 19 is a sectional view illustrating an LED according to a further exemplary embodiment of the present invention.

Referring to FIG. 19, compound semiconductor layers including an N-type semiconductor layer 55, an active layer 57, and a P-type semiconductor layer 59 are formed on a bonding substrate 71. Although the bonding substrate 71 may be a sapphire substrate, the bonding substrate is not limited thereto but may be another heterogeneous substrate. The compound semiconductor layers are III-N-based compound semiconductor layers. For example, the compound semiconductor layers are (Al, Ga, In)N semiconductor layers.

A metal reflection layer 61, an insulating structure 62, and a metal material structure 63 are interposed between the compound semiconductor layers and the bonding substrate 71.

The metal reflection layer 61 is formed of a metallic material having high reflectance, e.g., Ag or Al.

The insulating structure 62 is formed to surround sides of the compound semiconductor layers and a portion of the surface which is formed with the metal reflection layer 61. The insulating structure 62 may include, for example, $SiO_2$, SiN, MgO, TaO, $TiO_2$, or polymer. After portions of the P-type semiconductor layer 59, the active layer 57, and the N-type semiconductor layer 55 are subjected to a mesa etching process, the insulating structure 62 is formed to surround the sides of the compound semiconductor layers exposed through the mesa etching process. At this time, the insulating structure 62 may comprise inner portion 62b and inner portion 62c surrounding the sides of the compound semiconductor layers, and outer portion 62a and outer portion 62d formed such that the portions filled with the metal material structure 63 for forming electrodes are interposed between the inner portion 62b and the outer portion 62a and the inner portion 62c and the outer portion 62d. The insulating structure 62 may be formed to have open regions so that the metal material structure 63 is exposed through at least a portion of the insulating structure 62. Therefore, the insulating structure 62 may be formed so that the inner portion 62b and the outer portion 62a and the inner portion 62c and the outer portion 62d are separated by the open regions filled with the metal material structure 63, or formed so that the inner portions 62b and the outer portion 62a and the inner portion 62c and the outer portion 62d are not completely separated but the metal material structure 63 is filled in open regions partially formed in places. It is shown in this figure that the inner portion 62b and the inner portion 62c are formed to cover the sides of the compound semiconductor layers and a portion of the P-type semiconductor layer 59 which is formed with the metal reflection layer 61. However, the present invention is not limited thereto. That is, the insulating structure 62 may be formed not to cover the portion of the P-type semiconductor layer 59 but to cover only the sides of the compound semiconductor layers.

The metal material structure 63 prevents metal elements from being diffused to the metal reflection layer 61 from an adhesive layer 67, so that the reflectance of the metal reflection layer 61 can be maintained. The metal material structure 63 protects the metal reflection layer 61 and also becomes a layer exposed when an etching process is performed after the removal of a sacrificial substrate. Residue may be produced from the metal material structure 63 by a dry etching process. The residue attach to the insulating structure 62 formed to surround the sides of the compound semiconductor layers. Accordingly, it is possible to prevent the influence that the corresponding residue electrically affect the N-type semiconductor layer 55, the active layer 57, and the P-type semiconductor layer 59.

In the exemplary embodiment, the metal material structure 63 being in contact with the P-type electrode 83b is filled in to the top surface of the insulating structure 62. However, the present invention is not limited thereto, but the P-type electrode 83b may be formed to be filled in to the bottom surface of the insulating structure 62 or a middle position of the insulating structure 62.

The adhesive layer 67 prevents the bonding substrate 71 from being separated from the metal reflection layer 61 by enhancing the adhesive strength between the bonding substrate 71 and the metal reflection layer 61.

Meanwhile, an N-type electrode 83a is formed on the N-type semiconductor layer 55, and the P-type electrodes 83b are formed on the metal material structure 63 exposed through the at least the portion (open regions) of the insulating structure 62. Accordingly, current is supplied through the N-type electrode 83a and the P-type electrodes 83b, whereby light is emitted.

FIG. 20, FIG. 21, FIG. 22, FIG. 23, FIG. 24, FIG. 25, FIG. 26, FIG. 27, and FIG. 28 are sectional views illustrating a method for fabricating an LED according to a further exemplary embodiment of the present invention.

Figure 20:
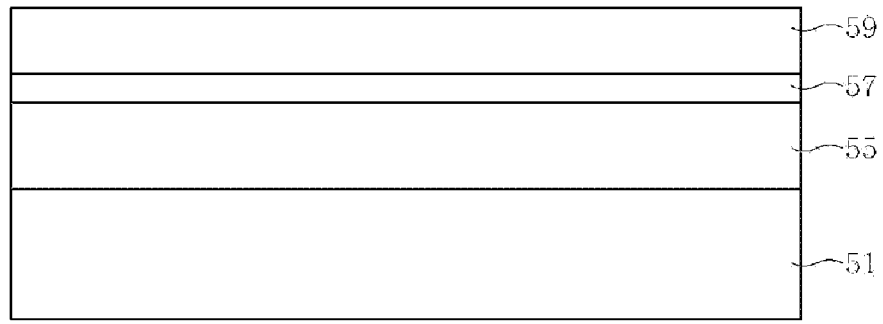
FIG. 20, FIG. 21, FIG. 22, FIG. 23, FIG. 24, FIG. 25, FIG. 26, FIG. 27, and FIG. 28 are sectional views illustrating a method for fabricating an LED according to a further exemplary embodiment of the present invention.

Referring to FIG. 20, compound semiconductor layers are formed on a sacrificial substrate 51. Although the sacrificial substrate 51 may be a sapphire substrate, the sacrificial substrate is not limited thereto but may be another heterogeneous substrate. The compound semiconductor layers include an N-type semiconductor layer 55, an active layer 57, and a P-type semiconductor layer 59. The compound semiconductor layers are III-N-based compound semiconductors and may be grown using an MOCVD method, an MBE method, or the like.

Meanwhile, before the compound semiconductor layers are formed, a buffer layer (not shown) may be formed on the sacrificial substrate 51. The buffer layer is employed to reduce lattice mismatch between the compound semiconductor layers and the sacrificial substrate 51, and may be generally a GaN-based material layer.

Figure 21:
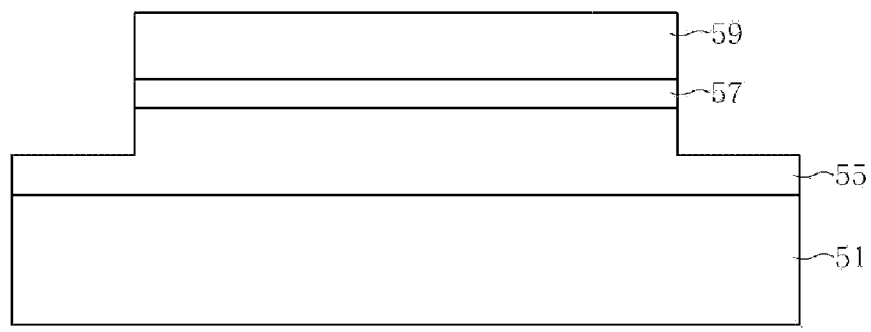

Referring to FIG. 21, the P-type semiconductor layer 59, the active layer 57, and the N-type semiconductor layer 55 are subjected to a mesa etching process. Accordingly, the sides of the P-type semiconductor layer 59, and the active layer 57, and at least a side of the N-type semiconductor layer 55 are exposed by partially etching the P-type semiconductor layer 59, the active layer 57, and the N-type semiconductor layer 55. At this time, the height of the exposed sides of the N-type semiconductor layer 55 may vary depending on the degree of etching.

Figure 22:
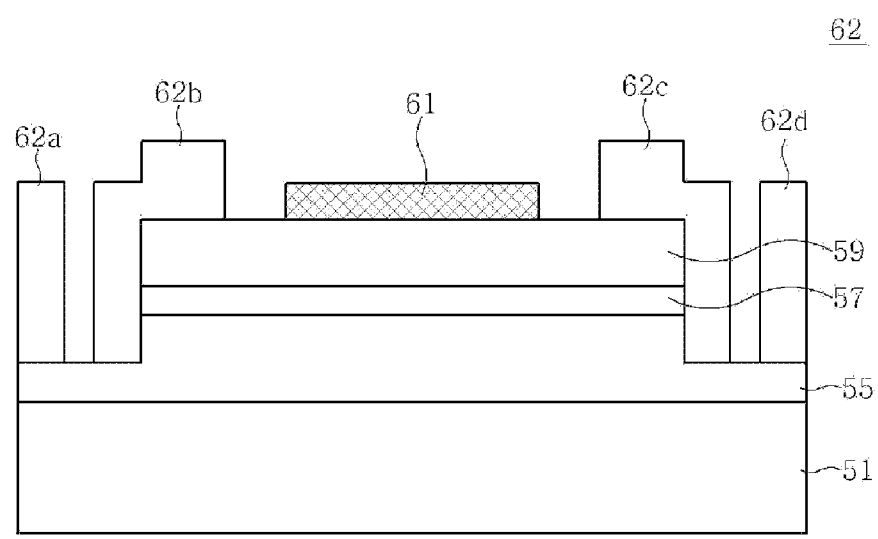

Referring to FIG. 22, a metal reflection layer 61 is formed on a region of the P-type semiconductor layer 59. For example, the metal reflection layer 61 may be formed of Ag or Al using a plating or deposition method.

Thereafter, an insulating structure 62 is formed on the N-type semiconductor layer 55. The insulating structure 62 may be formed to have thickness higher than that of the metal reflection layer 61. However, the present invention is not limited thereto but may be modified without limit. The insulating structure 62 is formed to surround the sides of the P-type semiconductor layer 59, the active layer 57, and the N-type semiconductor layer 55. At least a portion of the insulating structure 62 is provided with open regions so that the N-type semiconductor layer 55 is exposed. Accordingly, the insulating structure 62 may include inner portion 62b and inner portion 62c surrounding the sides of the compound semiconductor layers, and outer portion 62a and outer portion 62d formed such that the open regions filled with the metal material structure 63 for forming electrodes are interposed between the inner portion 62b the outer portion and 62a and the inner portion 62c and the outer portion 62d.

At this time, the open regions formed to allow the N-type semiconductor layer 55 to be exposed in the insulating structure 62 may be formed at other places of the insulating structure 62 or formed so that the inner portion 62b and the inner portion 62c and the outer portion 62a and the outer portion 62d are separated from each other by the open regions.

Figure 23:
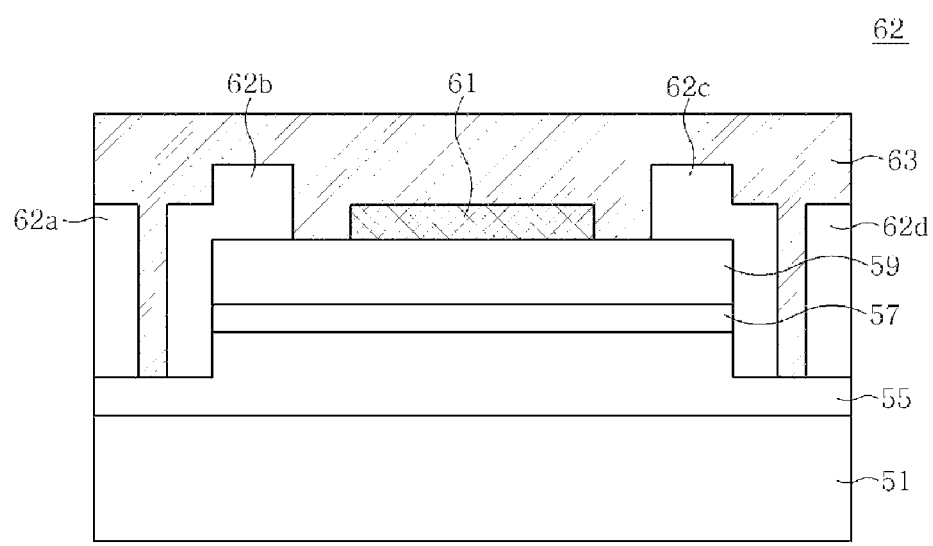

Referring to FIG. 23, after the insulating structure 62 is formed, the metal material structure 63 is formed. The metal material structure 63 may formed of, for example, Ni, Ti, Ta, Pt, W, Cr, Pd, or the like. The metal material structure 63 is formed on the portions of the N-type semiconductor layer 55 exposed through the open regions of the insulating structure 62, the metal reflection layer 61, and the P-type semiconductor layer 59 exposed between the inner portion 62b and the inner portion 62c of the insulating structure 62 and the metal reflection layer 61.

Figure 24:
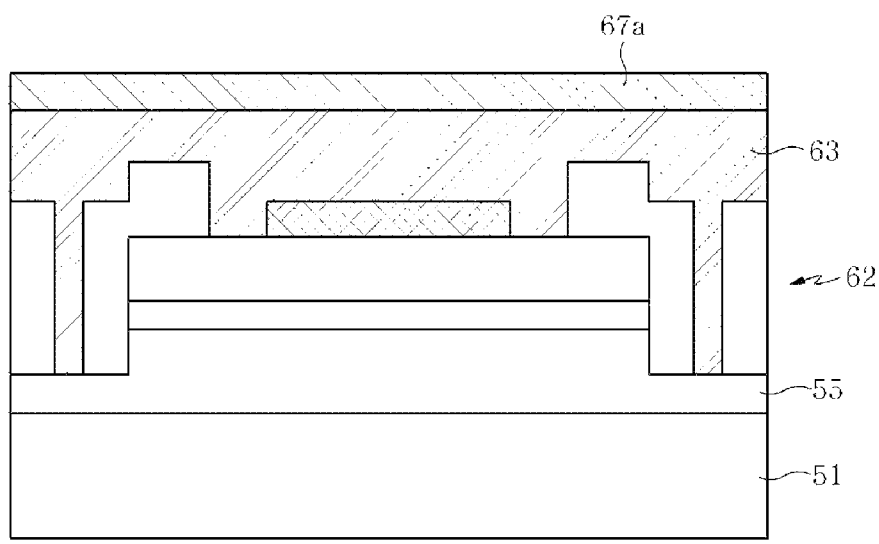

Referring to FIG. 24, a first bonding metal 67a is formed on the insulating structure 62. For example, the first bonding metal 67a may be formed to have a thickness of 15,000 Å using AuSn (80/20 wt %).

Figure 25:
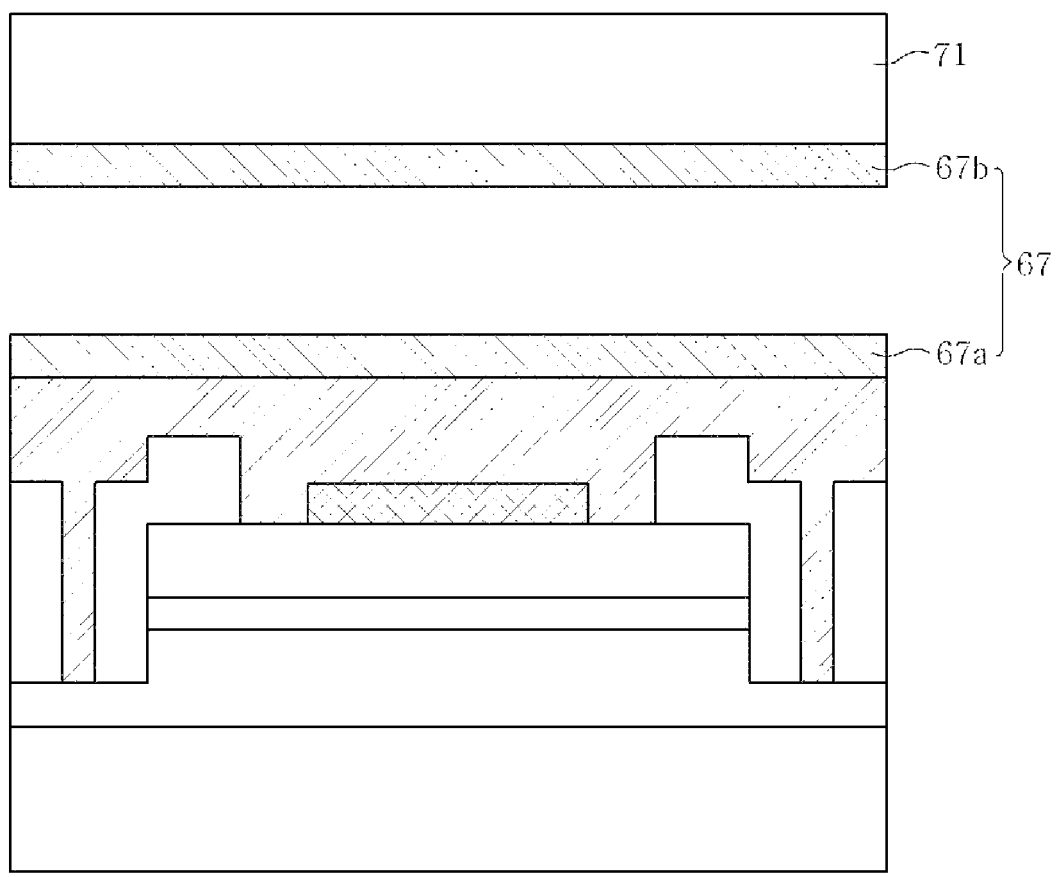

Referring to FIG. 25, a bonding substrate 71 having a second bonding metal 67b formed thereon is bonded on the first bonding metal 67a. Together the first bonding metal 67a and the second bonding metal 67b form the adhesive layer 67.

Figure 26:
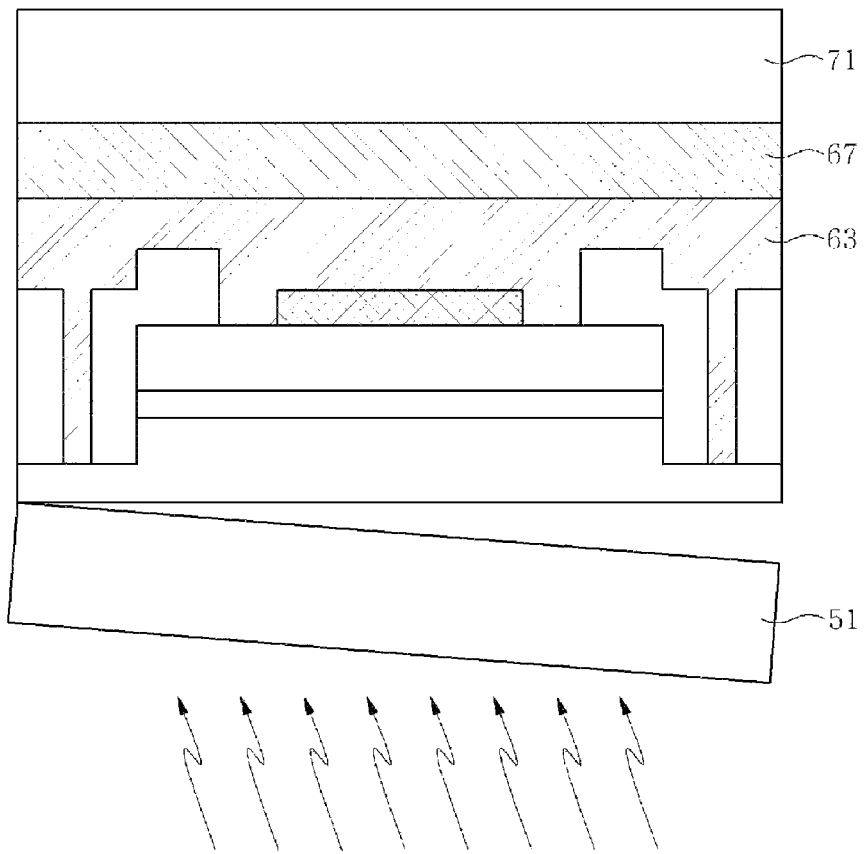
Figure 27:
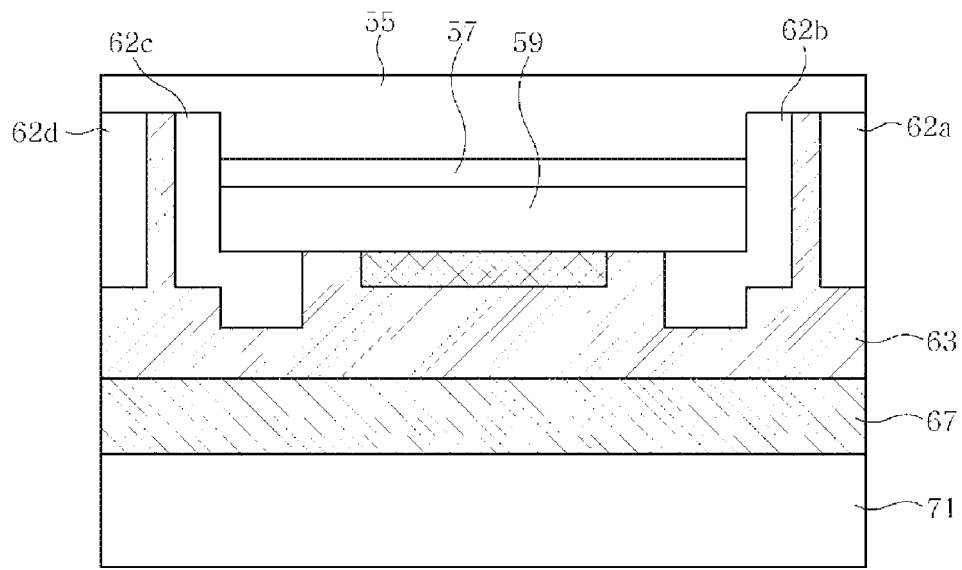

Referring to FIG. 26, the sacrificial layer 51 is separated from the compound semiconductor layers. The sacrificial substrate 51 may be separated using an LLO method or another mechanical or chemical method. At this time, the buffer layer (not shown) is also removed so that the N-type semiconductor layer 55 is exposed. The N-type semiconductor layer 55 exposed through the removal of the sacrificial layer 51 is made to face upward, thereby having the shape shown in FIG. 27.

Figure 28:
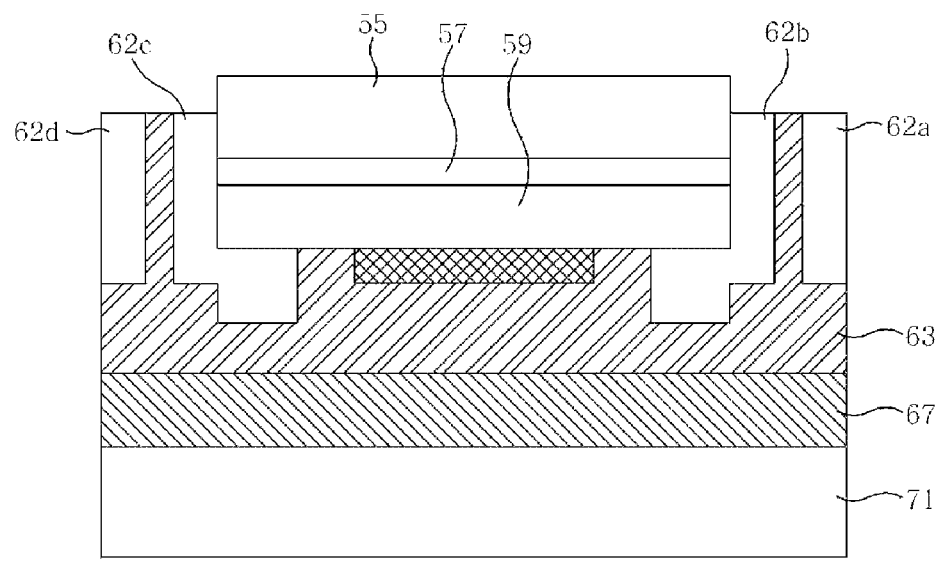
Figure 29:
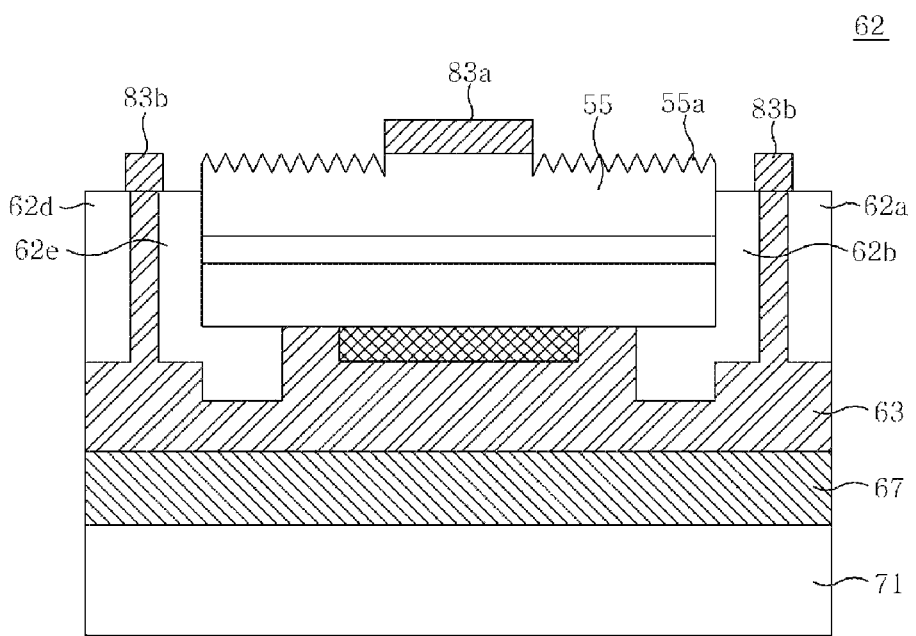
FIG. 29 is a sectional view illustrating a method for fabricating an LED according to a still further exemplary embodiment of the present invention.

Referring to FIG. 28, a dry etching process is performed to separate the compound semiconductor layers into unit cell regions and to expose the metal material structure 63 necessary for supplying current to the P-type semiconductor layer 59. The N-type semiconductor layer 55 is partially etched through the dry etching process. The metal material structure 63 may be partially etched, and accordingly, residue from the metal material structure 63 may be produced. However, the sides of the N-type semiconductor layer 55, the active layer 57, and the P-type semiconductor layer 59 are surrounded by the insulating structure 62, so that the residue from the metal material structure 63 have no electrical influence on the N-type semiconductor layer 55, the active layer 57, and the P-type semiconductor layer 59. Thereafter, an N-type electrode 83a is formed on the N-type semiconductor layer 55, and P-type electrodes 83b are formed on the metal material structure 63 exposed through the dry etching process, thereby completing the LED shown in FIG. 19. In addition, as shown in FIG. 29, the N-type semiconductor layer 55 on which the N-type electrode 83a is formed is formed with a concavo-convex surface 55a through a roughening process, thereby improving light extraction efficiency.

For example, although it has been described in the exemplary embodiment of the present invention that the insulating structure 62 is formed to extend on at least a portion of the bottom surface of the P-type semiconductor layer 59, the present is not limited thereto.

Further, although it has been described in the exemplary embodiment of the present invention that the insulating structure 62 is formed to be spaced apart from the metal reflection layer 61, the present invention is not limited thereto. That is, in another exemplary embodiment of the present invention, the insulating structure 62 may be formed to extend so as to be in contact with a side of the metal reflection layer 61. In a further exemplary embodiment of the present invention, the insulating structure 62 may be formed to extend so as to cover at least a portion of the metal reflection layer 61. In a still further exemplary embodiment of the present invention, the insulating structure 62 may be formed to extend so as to cover at least a portion of the metal reflection layer 61 while being in contact with a side of the metal reflection layer 61.

In the exemplary embodiment of the present invention, portions of the sides of the N-type semiconductor layer 55 are not covered by the insulating structure 62. However, the present invention is not limited thereto. That is, both sides of the N-type semiconductor layer 55 may be covered by the insulating structure 62.

Figure 30:
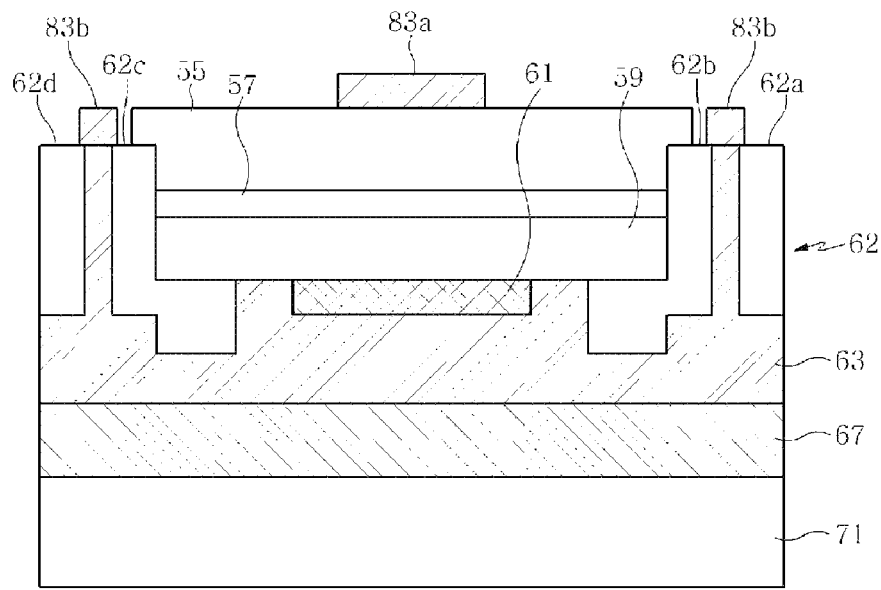
FIG. 30 and FIG. 31 are sectional views illustrating an LED according to a still further exemplary embodiment of the present invention.
Figure 31:
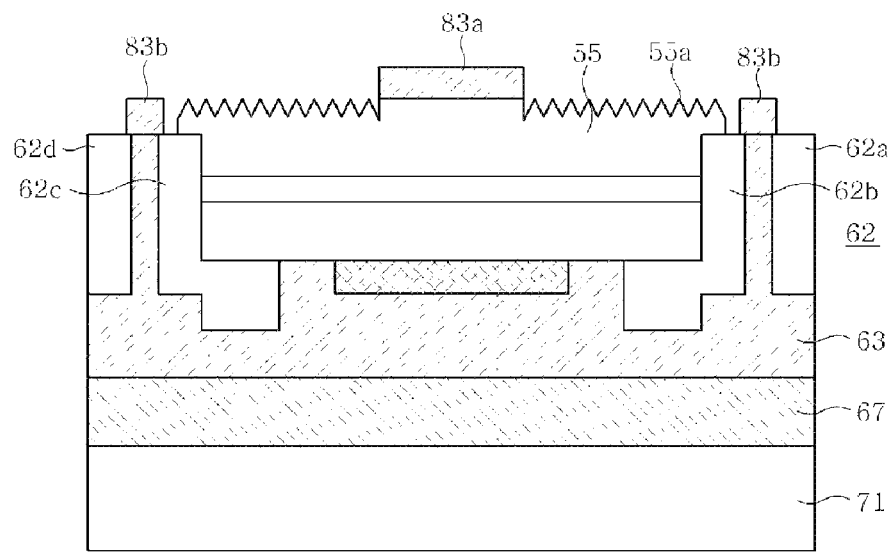

As a modification of the present invention, a portion of the N-type semiconductor layer 55 may be formed to extend so as to cover a portion of the top of the insulating structure 62 as shown in FIG. 30 and FIG. 31, and a concavo-convex surface is formed on the surface of the extended portion, thereby improving light extraction efficiency.

Figure 32:
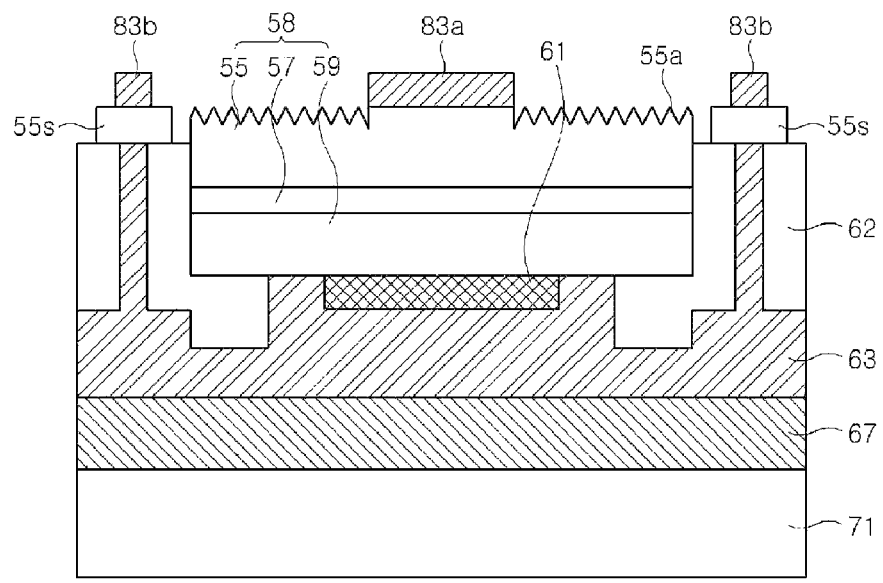
FIG. 32 and FIG. 33 are sectional views illustrating an LED according to a yet further exemplary embodiment of the present invention.

As another modification of the present invention, a separated layer 55s of an N-type semiconductor is formed while being spaced apart from a light emitting structure 58 including an N-type semiconductor layer 55, an active layer 57, and a P-type semiconductor layer 59, and a P-type electrode 83b is formed on the separated layer 55s as shown in FIG. 32. Since the P-type electrode 83b is formed on the separated layer 55s of the N-type semiconductor layer, the adhesion of the P-type electrode 83b can be improved.

The separated layer 55s is formed of an N-type semiconductor which has the same conductive type as the N-type semiconductor layer 55, and positioned to be spaced apart from the light emitting structure 58. The separated layers 55s may be formed at one or more positions around the light emitting structure 58. Alternatively, the separated layer 55s may be formed in a shape for surrounding the light emitting structure 58, i.e., a ring shape, e.g., a square ring shape.

The separated layer 55s may be formed by being grown together with the N-type semiconductor layer 55 and then separated from the N-type semiconductor layer 55. Accordingly, the separated layer 55s can be positioned on the same level as the N-type semiconductor layer 55, and formed of the same material as at least a portion of the N-type semiconductor layer 55.

Meanwhile, the insulating structure 62 may have a through-hole, through which the separated layer 55s is exposed, and the metal material structure 63 may be electrically connected to the separated layer 55s through the through-hole. A plurality of through-holes may be formed around the light emitting structure 58. Alternatively, the insulating structure 62 may be limited on a side circumference of the light emitting structure 58, and the metal material layer 63 may be electrically connected to the separated layer 55s by covering the insulating structure 62 and the separated layer 55s.

Figure 33:
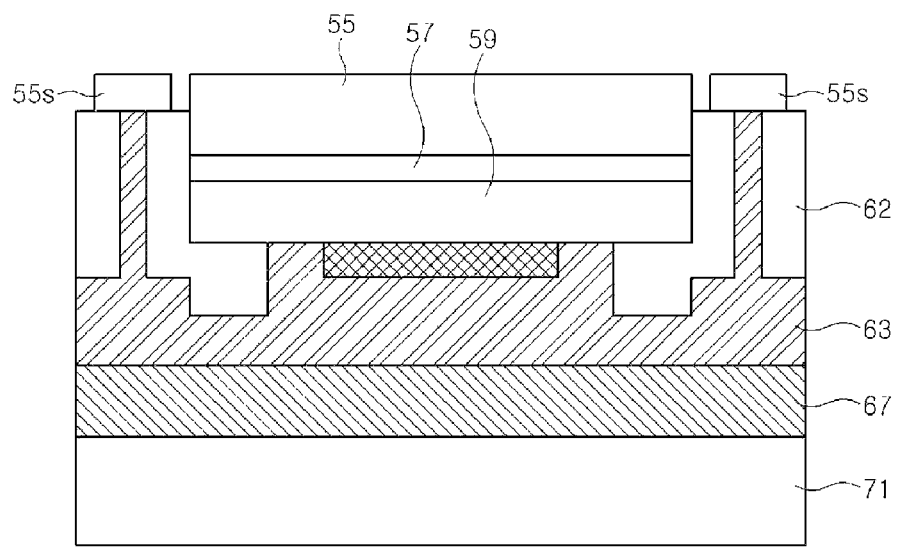

A method for fabricating the light emitting device of FIG. 32 will be described. After the process related to FIG. 27, a process of FIG. 33 is performed. Referring to FIG. 33, a region of the N-type semiconductor layer 55 formed around a mesa is partially separated from the N-type semiconductor layer 55 formed on the mesa by patterning the exposed N-type semiconductor layer 55. Accordingly, a light emitting structure 58 (see FIG. 32) is completed, and a separated layer 55s spaced apart from the light emitting structure 58 is formed.

Thereafter, an N-type electrode 83a is formed on the N-type semiconductor layer 55 on the mesa, and a P-type electrode 83b is formed on the separated layer 55s. The N-type electrode 83a and the P-type electrodes 83b may be formed of the same material. Meanwhile, the upper surface 55a of the N-type semiconductor layer 55 on the mesa may be formed to be rough by a photoelectrochemical (PEC) etching process or the like. The roughened surface may be formed before or after the N-type electrode 83a is formed. Accordingly, the light emitting device of FIG. 32 is completed.

According to an exemplary embodiment of the present invention, when a light emitting device is fabricated by forming a metal reflection layer, a metal material structure and a bonding substrate on compound semiconductor layers, an insulating structure is formed on a portion through which the metal material structure that may produce metal residue may be exposed. Accordingly, when a dry etching process is performed, the exposure of the metal material structure is prevented or minimized, so that it is possible to effectively reduce deterioration of electrical characteristics due to adhesion of residue from a metal material structure to compound semiconductors, which is conventionally brought up in a dry etching process.

According to an exemplary embodiment of the present invention, when a light emitting device is fabricated by forming a metal reflection layer, a metal material structure, and a bonding substrate on compound semiconductor layers, the sides of the compound semiconductor layers are protected by an insulating structure, so that it is possible to effectively prevent deterioration of electrical characteristics due to adhesion of residue from a metal material structure to the sides of compound semiconductors, which is conventionally brought up in a dry etching process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting device, comprising:
   compound semiconductor layers comprising a first semiconductor layer, an active layer, and a second semiconductor layer;
   a metal material structure disposed on the second semiconductor layer;
   a metal reflection layer embedded in the metal material structure, to reflect light toward the compound semiconductor layers;
   an insulating structure disposed between the metal material structure and the periphery of the second semiconductor layer; and
   a substrate disposed on the metal material structure.

2. The light emitting device of claim 1, wherein the substrate is a conductive substrate.

3. The light emitting device of claim 1, wherein the substrate is a sapphire substrate.

4. The light emitting device of claim 1, wherein the insulating structure comprises a material selected from the group consisting of $SiO_2$, SiN, MgO, TaO, $TiO_2$, and a polymer.

5. The light emitting device of claim 1, wherein:
   an exposed portion of the metal material structure extends through the insulating structure; and
   the light emitting device further comprises a first electrode disposed on the first semiconductor layer, and a second electrode disposed on the exposed portion of the metal material structure.

6. The light emitting device of claim 5, wherein the top surface of a portion of the metal material structure is coplanar with the top surface of the insulating structure.

7. The light emitting device of claim 5, wherein the insulating structure directly contacts the metal material structure.

8. The light emitting device of claim 1, wherein the insulating structure directly contacts the second semiconductor layer.

9. The light emitting device of claim 1, wherein the insulating structure surrounds the metal reflection layer.

10. A light emitting device, comprising:
    compound semiconductor layers comprising a first semiconductor layer, an active layer, and a second semiconductor layer;
    a metal material structure disposed on the second semiconductor;
    a metal reflection layer embedded in the metal material structure, to reflect light toward the compound semiconductor layers;
    an insulating structure disposed on the metal material structure and contacting edge portions of the second semiconductor layer and the active layer; and
    a substrate disposed on the metal material structure,
    wherein an exposed portion of the metal material structure extends through the insulating structure.

11. The light emitting device of claim 10, further comprising a first electrode disposed on the first semiconductor layer; and
    a second electrode disposed on the exposed portion of the metal material structure.

12. The light emitting device of claim 11, wherein the top surface of a portion of the metal material structure is coplanar with the top surface of the insulating structure.

13. The light emitting device of claim 11, wherein the insulating structure directly contacts the metal material structure.

14. The light emitting device of claim 10, wherein the insulating structure is disposed around the periphery of the first semiconductor layer.

15. The light emitting device of claim 10, wherein the insulating structure comprises a material selected from the group consisting of $SiO_2$, SiN, MgO, TaO, $TiO_2$, and polymer.

16. The light emitting device of claim 10, wherein the insulating structure directly contacts the second semiconductor layer.

17. The light emitting device of claim 10, wherein the insulating structure surrounds the metal reflection layer.

18. A light emitting device, comprising:
    a substrate;
    a light emitting structure disposed on the substrate, the light emitting structure comprising a first upper semiconductor layer, an active layer, and a lower semiconductor layer;
    a second upper semiconductor layer disposed on the substrate and separated from the light emitting structure;
    a metal material structure positioned between the light emitting structure and the second upper semiconductor layer, to electrically connect the lower semiconductor layer and the second upper semiconductor layer; and
    an insulating structure to insulate the metal material structure from the first upper semiconductor layer and the active layer.

19. The light emitting device of claim 18, further comprising a first electrode pad disposed on the light emitting structure, and a second electrode pad disposed on the second upper semiconductor layer.

20. The light emitting device of claim 18, further comprising a metal reflection layer embedded in the metal material structure, to reflect light toward the light emitting structure, wherein the metal material structure comprises a protective metal layer to cover the metal reflection layer.

21. The light emitting device of claim 18, wherein the first upper semiconductor layer and the second upper semiconductor layer comprise the same type of semiconductor material.

* * * * *